(12) United States Patent
Nirschl et al.

(10) Patent No.: US 7,499,344 B2
(45) Date of Patent: Mar. 3, 2009

(54) INTEGRATED CIRCUIT MEMORY HAVING A READ CIRCUIT

(75) Inventors: Thomas Nirschl, Loiching (DE); Heinz Hönigschmid, Pöcking (DE)

(73) Assignee: Infineon Technologies AG, Munich (DE)

( * ) Notice: Subject to any disclaimer, the term of this patent is extended or adjusted under 35 U.S.C. 154(b) by 261 days.

(21) Appl. No.: 11/326,235

(22) Filed: Jan. 5, 2006

(65) Prior Publication Data
US 2007/0153569 A1    Jul. 5, 2007

(51) Int. Cl.
*G11C 7/06* (2006.01)

(52) U.S. Cl. .................. 365/189.07; 365/148; 365/158; 365/163; 365/171; 365/189.01; 365/189.05

(58) Field of Classification Search ............. 365/148 X, 365/158 X, 171 X, 189.01 O, 203, 148, 158, 365/171, 189.01, 163, 189.05, 189.07
See application file for complete search history.

(56) References Cited

U.S. PATENT DOCUMENTS

| 4,616,148 | A  |   | 10/1986 | Ochii et al. |
|-----------|----|---|---------|--------------|
| 4,620,297 | A  |   | 10/1986 | Houston |
| 4,831,590 | A  |   | 5/1989  | Ichinose |
| 4,897,569 | A  | * | 1/1990  | Calzi ........................... 327/53 |
| 5,138,577 | A  |   | 8/1992  | Oh |
| 5,696,719 | A  |   | 12/1997 | Baek et al. |
| 6,304,506 | B1 |   | 10/2001 | Huang et al. |
| 6,717,865 | B2 |   | 4/2004  | Laurent |
| 6,724,672 | B2 | * | 4/2004  | Nirschl ....................... 365/203 |
| 2006/0077737 | A1 | * | 4/2006 | Ooishi ........................ 365/203 |

* cited by examiner

*Primary Examiner*—VanThu Nguyen
(74) *Attorney, Agent, or Firm*—Dicke, Billig & Czaja, PLLC

(57) ABSTRACT

A memory includes a resistive memory cell and a circuit configured to provide an output signal indicating a state of the memory cell based on a comparison of a voltage across the memory cell to a threshold voltage.

8 Claims, 3 Drawing Sheets

INTEGRATED CIRCUIT MEMORY HAVING A READ CIRCUIT

BACKGROUND

One type of non-volatile memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase-change memory. Phase-change memory uses a phase-change material for the resistive memory element.

Phase-change memories are based on phase-change materials that exhibit at least two different states. Phase-change material may be used in memory cells to store bits of data. The states of phase-change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase-change materials exhibit more than one crystalline state, e.g. a face-centered cubic (FCC) state and a hexagonal closest packing (HCP) state. These two crystalline states have different resistivities and may be used to store bits of data.

Phase change in the phase-change materials may be induced reversibly. In this way, the memory may change from the amorphous state to the crystalline state and from the crystalline state to the amorphous state, in response to temperature changes. The temperature changes to the phase-change material may be achieved in a variety of ways. For example, a laser can be directed to the phase-change material, current may be driven through the phase-change material, or current can be fed through a resistive heater adjacent the phase-change material. In any of these methods, controllable heating of the phase-change material causes controllable phase change within the phase-change material.

A phase-change memory including a memory array having a plurality of memory cells that are made of phase-change material may be programmed to store data utilizing the memory states of the phase-change material. One way to read and write data in such a phase-change memory device is to control a current and/or a voltage pulse that is applied to the phase-change material. The level of current and/or voltage generally corresponds to the temperature induced within the phase-change material in each memory cell.

To achieve higher density phase-change memories, a phase-change memory cell can store multiple bits of data. Multi-bit storage in a phase-change memory cell can be achieved by programming the phase-change material to have intermediate resistance values or states. If the phase-change memory cell is programmed to one of three different resistance levels, 1.5 bits of data per cell can be stored. If the phase-change memory cell is programmed to one of four different resistance levels, two bits of data per cell can be stored, and so on. In principle it is possible to store three or more states. To program a phase-change memory cell to an intermediate resistance value, the amount of crystalline material coexisting with amorphous material and hence the cell resistance is controlled via a suitable write strategy.

SUMMARY

One embodiment of the present invention provides a memory. The memory includes a resistive memory cell and a circuit configured to provide an output signal indicating a state of the memory cell based on a comparison of a voltage across the memory cell to a threshold voltage.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
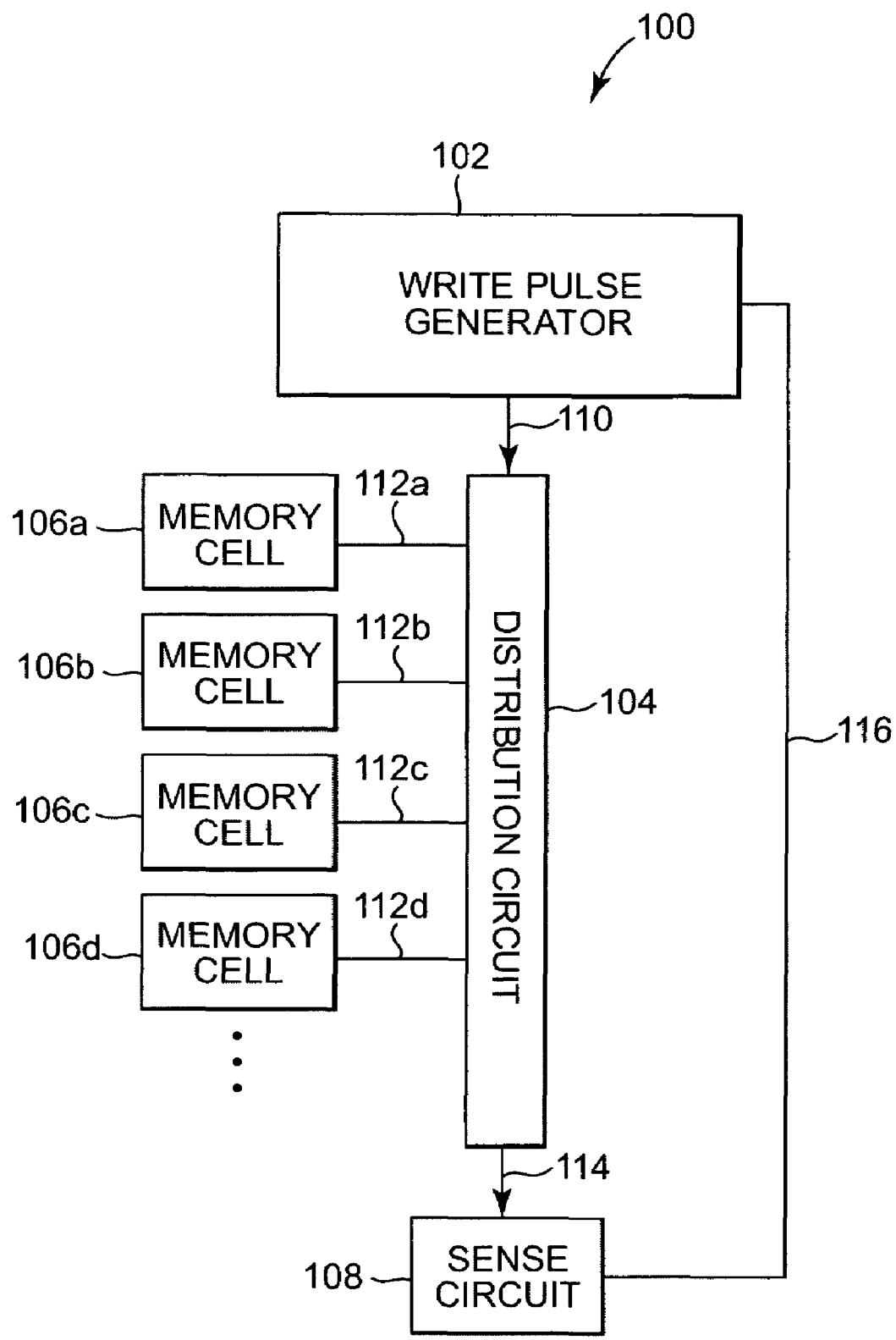
FIG. 1 is a block diagram illustrating one embodiment of a memory device.

FIG. 1 is a block diagram illustrating one embodiment of a memory device 100. Memory device 100 includes a write pulse generator 102, a distribution circuit 104, memory cells 106a, 106b, 106c, and 106d, and a sense circuit 108. Each of the memory cells 106a-106d is a resistive memory cell, such as a phase-change memory cell that stores data based on the amorphous and crystalline states of phase-change material in the memory cell. Also, each of the memory cells 106a-106d can be programmed into more than two states by programming the phase-change material to have intermediate resistance values. To program one of the memory cells 106a-106d to an intermediate resistance value, the amount of crystalline material coexisting with amorphous material—and hence the cell resistance—is controlled via a suitable write strategy. In another embodiment, memory cells 106a-106d are conductive-bridging random access memory (CBRAM) cells, magneto-resistive random access memory (MRAM) cells, or other suitable memory cells that store data as resistance values.

Sense circuit 108 senses the state of the memory cell and provides signals that indicate the state of the resistance of the memory cell. Sense circuit 108 reads each of the more than two states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d.

To read a memory cell 106a-106d, a bit line coupled to the memory cell is first precharged. Next, the memory cell is selected. In one embodiment, the voltage across the memory cell is input to a Schmitt-trigger. The Schmitt-trigger provides an output signal indicating the state of the memory cell based on the input voltage. In another embodiment, an input current through the selected memory cell is mirrored to provide one or more output currents, with each output current having a different ratio to the input current. In response to each output current, input voltages are generated as inputs to respective Schmitt-triggers. Each Schmitt-trigger provides an output signal based on the corresponding input voltage. The output signals from the Schmitt-triggers are used to determine the state of the selected memory cell and hence the data stored in the memory cell. The number of states and hence the number of data bits that can be sensed for each memory cell is related to the number of Schmitt-triggers used. For example, at least two Schmitt-triggers are used to sense three different states.

Write pulse generator 102 provides pulses to memory cells 106a-106d and programs one of the more than two resistance levels or states into the phase-change material of each of the memory cells 106a-106d. Write pulse generator 102 is electrically coupled to distribution circuit 104 through signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. In addition, distribution circuit 104 is electrically coupled to sense circuit 108 through signal path 114, and sense circuit 108 is electrically coupled to write pulse generator 102 through signal path 116.

Each of the memory cells 106a-106d includes a phase-change material that may be changed from an amorphous state to a crystalline state or from a crystalline state to an amorphous state under the influence of temperature change. The amount of crystalline material coexisting with amorphous material in the phase-change material of one of the memory cells 106a-106d thereby defines more than two states for storing data within memory device 100. In the amorphous state, a phase-change material exhibits significantly higher resistivity than in the crystalline state. Therefore, the more than two states of memory cells 106a-106d differ in their electrical resistivity. In one embodiment, the more than two states can be three states and a trinary system can be used, wherein the three states are assigned bit values of "0", "1", and "2". In one embodiment, the more than two states are four states that can be assigned multi-bit values, such as "00", "01", "10", and "11". In other embodiments, the more than two states can be any suitable number of states in the phase-change material of a memory cell.

In one embodiment, write pulse generator 102 provides voltage pulses to distribution circuit 104 through signal path 110 and distribution circuit 104 controllably directs the voltage pulses to memory cells 106a-106d through signal paths 112a-112d. In one embodiment, distribution circuit 104 includes a plurality of transistors that controllably direct voltage pulses to each of the memory cells 106a-106d. In other embodiments, write pulse generator 102 provides current pulses to distribution circuit 104 through signal path 110 and distribution circuit 104 controllably directs the current pulses to memory cells 106a-106d through signal paths 112a-112d.

In operation of one embodiment, write pulse generator 102 resets the phase-change material in memory cells 106a-106d. A reset operation includes heating the phase-change material of the target memory cell above its melting temperature and quickly cooling the phase-change material to thereby achieve a substantially amorphous state. This amorphous state is one of the more than two states of each of the memory cells 106a-106d and is the highest resistance state.

Write pulse generator 102 is configured to program a selected one of the more than two states into a selected one of the memory cells 106a-106d. Write pulse generator 102 provides a signal to the selected one of the memory cells 106a-106d to crystallize part of the phase-change material and thereby lower the resistance of the selected one of the memory cells 106a-106d.

In one embodiment, a memory cell 106a-106d is precharged by one or more precharge circuits. Sense circuit 108 includes a Schmitt-trigger for sensing the voltage across a memory cell 106a-106d after the memory cell 106a-106d is selected. The Schmitt-trigger provides a logic high signal in response to a memory cell having a low resistance value, and provides a logic low signal in response to the memory cell having a high resistance value. In another embodiment, sense circuit 108 includes a plurality of Schmitt-triggers. Each Schmitt-trigger receives an input voltage generated in response to an output current mirrored from an input current, which is the current through a selected memory cell. Each output current has a different ratio to the input current for indicating the state of the memory cell. Based on the outputs of the Schmitt-triggers, the state of the memory cell is determined.

Figure 2:
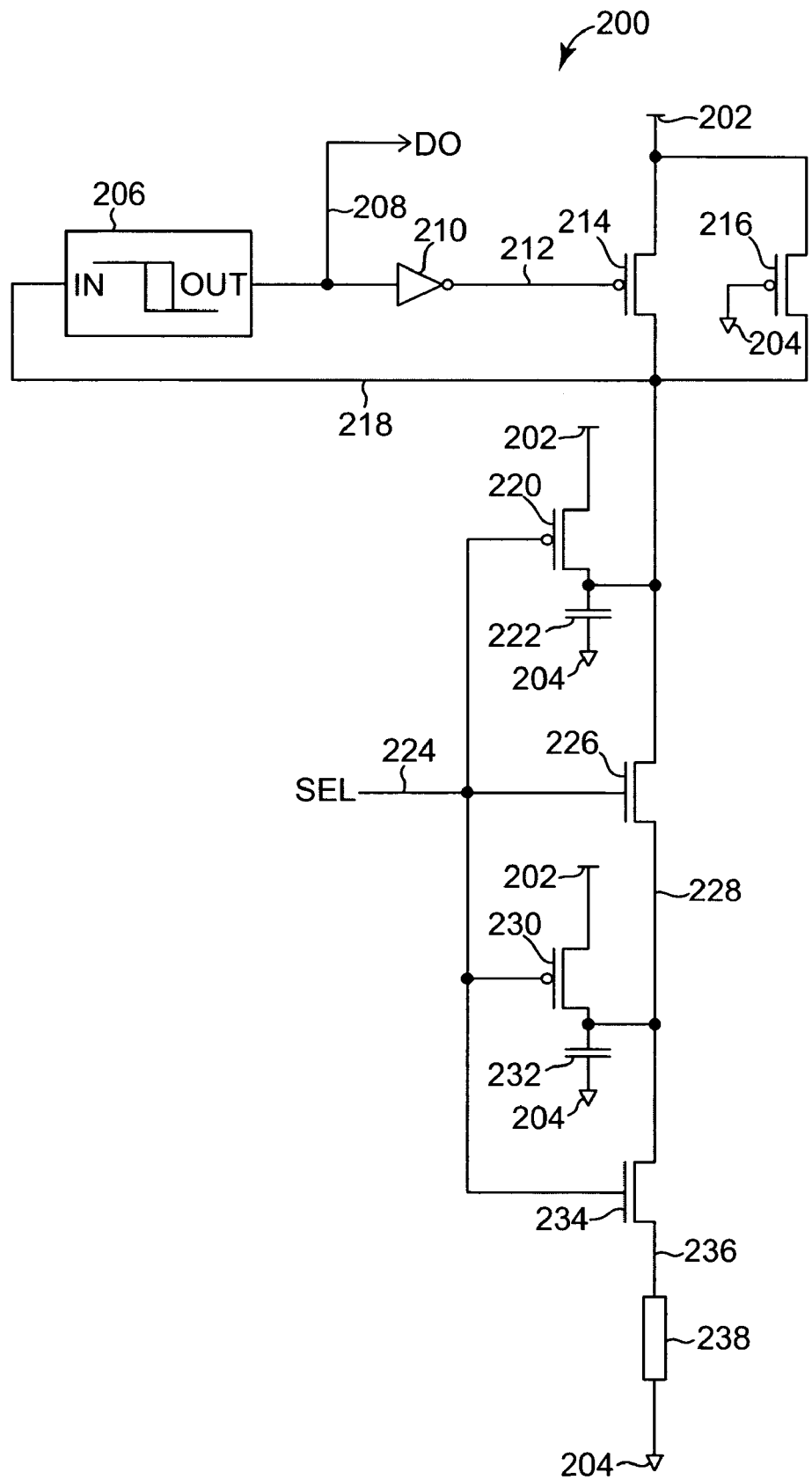
FIG. 2 is a schematic diagram illustrating one embodiment of a circuit for reading the state of a memory cell.

FIG. 2 is a schematic diagram illustrating one embodiment of a circuit 200 for reading the state of a memory cell 238. Circuit 200 includes Schmitt-trigger 206, inverter 210, transistors 214, 216, 220, 226, 230, and 234, parasitic capacitance 222 and 232, and memory cell 238. The input of Schmitt-trigger 206 is electrically coupled to one side of the source-drain path of transistor 214, one side of the source-drain path of transistor 216, one side of the source-drain path of transistor 220, one side of parasitic capacitance 222, and one side of the source-drain path of transistor 226 through signal path 218. The output of Schmitt-trigger 206 provides the data out (DO) signal and is electrically coupled to the input of inverter 210 through DO signal path 208. The output of inverter 210 is electrically coupled to the gate of transistor 214 through signal path 212. The other side of the source-drain path of transistor 214 is electrically coupled to a voltage source 202, such as VDD. The other side of the source-drain path of transistor 216 is electrically coupled to voltage source 202. The gate of transistor 216 is electrically coupled to a common bias or ground 204.

The other side of the source-drain path of transistor 220 is electrically coupled to voltage source 202. The gate of transistor 220, the gate of transistor 226, the gate of transistor 230, and the gate of transistor 234 receive the select (SEL) signal on SEL signal path 224. The other side of parasitic capacitance 222 is electrically coupled to common bias or ground 204. The other side of the source-drain path of transistor 226 is electrically coupled to one side of the source-drain path of transistor 230, one side of parasitic capacitance 232, and one side of the source-drain path of transistor 234 through signal path 228. The other side of the source-drain path of transistor 230 is electrically coupled to voltage source 202. The other side of parasitic capacitance 232 is electrically coupled to common bias or ground 204. The other side of the source-drain path of transistor 234 is electrically coupled to one side of memory cell 238 through signal path 236. The other side of memory cell 238 is electrically coupled to common bias or ground 204.

Transistors 214, 216, 220, and 230 are p-channel metal-oxide-semiconductor (PMOS) transistors, and transistors 226 and 234 are n-channel metal-oxide-semiconductor (NMOS) transistors. Memory cell 238 is a resistive memory cell, such as a phase-change memory cell, a CBRAM cell, an MRAM cell, or other suitable resistive type non-volatile memory cell. Memory cell 238 stores one or more bits of data as a resistance level.

Schmitt-trigger 206 receives an input voltage on signal path 218 to provide an output signal on DO signal path 208. Schmitt-trigger 206 includes a first threshold voltage and a second threshold voltage. The first threshold voltage is less than the second threshold voltage. In response to the input voltage on signal path 218 falling below the first threshold voltage, Schmitt-trigger 206 outputs a logic high DO signal on DO signal path 208. In response to the input voltage on signal path 218 rising above the second threshold voltage, Schmitt-trigger 206 outputs a logic low DO signal on DO signal path 208. In response to the input voltage on signal path 218 being between the first threshold voltage and the second threshold voltage, Schmitt-trigger 206 maintains the DO signal at its current logic level on DO signal path 208. Schmitt-trigger 206 maintains the DO signal at its current logic level until the input voltage on signal path 218 rises or falls a sufficient amount to trigger a change in the logic level of the DO signal.

Inverter 210 inverts the DO signal on DO signal path 208 to provide the signal on signal path 212. Transistor 214 provides a holding device for maintaining a logic high DO signal in response to a logic high DO signal from Schmitt-trigger 206. In response to a logic low signal on signal path 212, transistor 214 turns on to provide a constant voltage on signal path 218. Schmitt-trigger 206 and/or transistor 214 are selected such that the constant voltage on signal path 218 is less than the second threshold voltage of Schmitt-trigger 206. In response to a logic high signal on signal path 212, transistor 214 turns off.

Transistor 216 provides a bypass device that is always on. In one embodiment, transistor 216 is replaced with a suitably sized resistor. Transistor 216 provides a voltage on signal path 218. The SEL signal is used to select memory cell 238. In response to a logic low SEL signal on SEL signal path 224, transistor 220 turns on to charge parasitic capacitance 222 and provide a precharge voltage on signal path 218. In response to a logic high SEL signal on SEL signal path 224, transistor 220 turns off. In response to a logic low SEL signal on SEL signal path 224, transistor 230 turns on to charge parasitic capacitance 232 and provide a precharge voltage on signal path 228. In response to a logic high SEL signal on SEL signal path 224, transistor 230 turns off.

In response to a logic low SEL signal on SEL signal path 224, transistor 226 turns off to block signals from passing between signal paths 218 and 228. In response to a logic high SEL signal on SEL signal path 224, transistor 226 turns on to pass signals between signal paths 218 and 228. In response to a logic low SEL signal on SEL signal path 224, transistor 234 turns off to block signals from passing between signal paths 228 and 236. In response to a logic high SEL signal on SEL signal path 224, transistor 234 turns on to pass signals between signal paths 228 and 236.

In operation, during a standby mode, the SEL signal is logic low. With the SEL signal logic low, transistors 220 and 230 are turned on to precharge signal paths 218 and 228 up to the voltage provided by voltage source 202. Transistor 216 is also on but does not add leakage current since both the source and the drain of transistor 216 are charged to the voltage provided by voltage source 202. To read memory cell 238, the resistance of the memory cell is sensed. Memory cell 238 is selected by providing a logic high SEL signal.

With the SEL signal logic high, transistors 220 and 230 turn off and transistors 226 and 234 turn on to select memory cell 238. If memory cell 238 is in a low resistance state, the voltage on signal path 218 is discharged to a small voltage level. The small voltage level is determined by the resistance of bypass transistor 216 and the resistance of memory cell 238. The small voltage level is less than the first threshold voltage of Schmitt-trigger 206. Therefore, Schmitt-trigger 206 outputs a logic high DO signal. The logic high DO signal is inverted by inverter 210 to turn on transistor 214. Transistor 214 and transistor 216 form a voltage divider with the resistance of memory cell 238 to provide a constant bias voltage on signal path 218. The constant bias voltage on signal path 218 is less than the second threshold voltage of Schmitt-trigger 206, such that the DO signal remains logic high.

If memory cell 238 is in a high resistive state, the voltage on signal path 218 is not discharged when memory cell 238 is selected. The voltage on signal path 218 remains above the first threshold voltage of Schmitt-trigger 206. Therefore, Schmitt-trigger 206 outputs a logic low DO signal. The logic low DO signal is inverted by inverter 210 to turn off transistor 214. Transistor 216 provides a small current to maintain a constant bias voltage on signal path 218. The constant bias voltage on signal path 218 is greater than the first threshold voltage of Schmitt-trigger 206, such that the DO signal remains logic low. The DO signal is latched by another circuit (not shown), which can be strobed to provide an output signal indicating the data stored in memory cell 238. The strobe signal is provided while the SEL signal is logic high.

Figure 3:
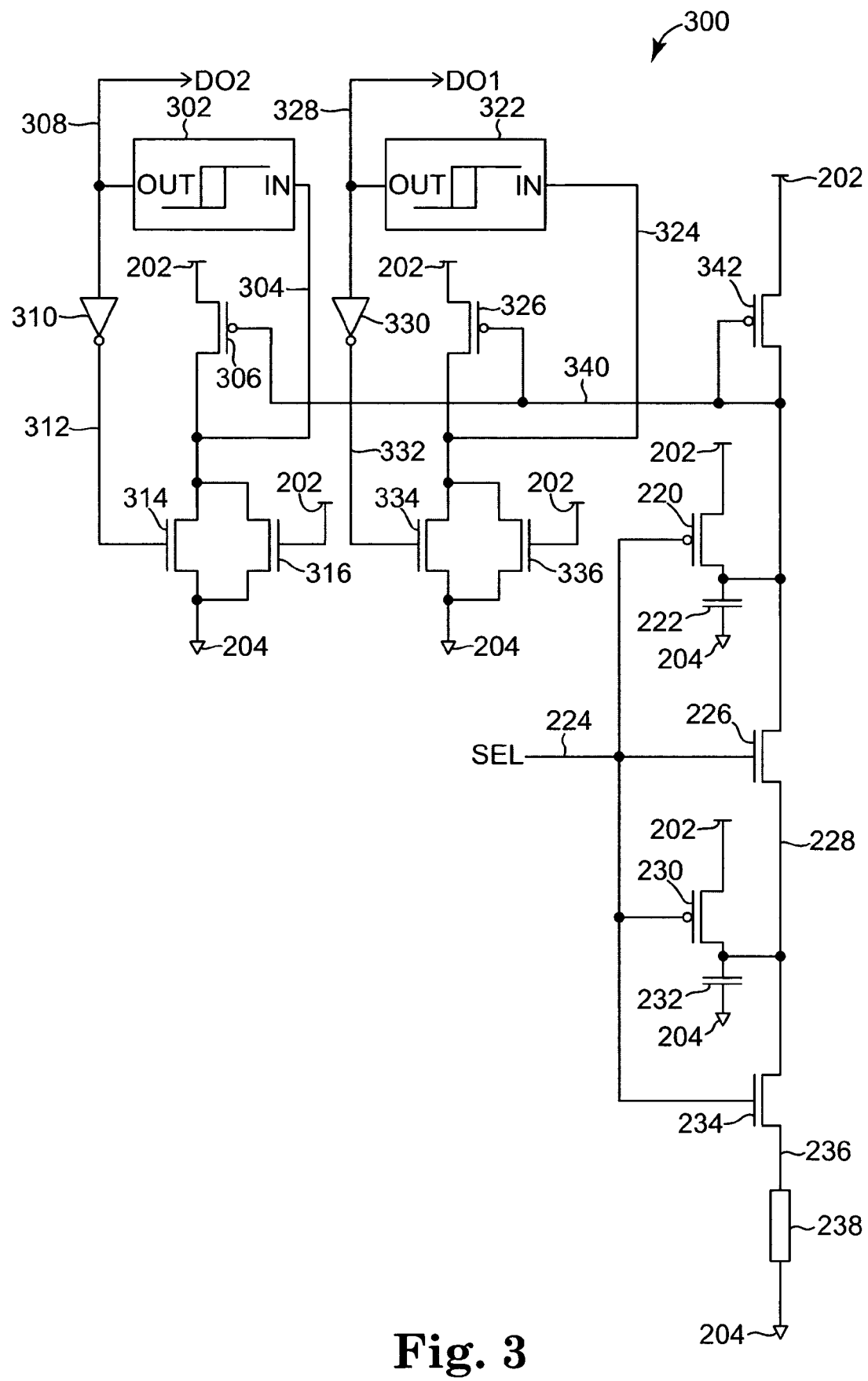
FIG. 3 is a schematic diagram illustrating another embodiment of a circuit for reading the state of a memory cell.

FIG. 3 is a schematic diagram illustrating another embodiment of a circuit 300 for reading the state of a memory cell 238. Circuit 300 includes Schmitt-triggers 302 and 322, inverters 310 and 330, transistors 306, 314, 316, 326, 334, 336, 342, 220, 226, 230, and 234, parasitic capacitance 222 and 232, and memory cell 238. The output of Schmitt-trigger 302 provides the data out two (DO2) signal and is electrically coupled to the input of inverter 310 through DO2 signal path 308. The output of inverter 310 is electrically coupled to the gate of transistor 314 through signal path 312. One side of the source-drain path of transistor 314 is electrically coupled to common bias or ground 204. The other side of the source-drain path of transistor 314 is electrically coupled to the input of Schmitt-trigger 302, one side of the source-drain path of transistor 306, and one side of the source-drain path of transistor 316 through signal path 304. The other side of the source-drain path of transistor 316 is electrically coupled to common bias or ground 204. The gate of transistor 316 is electrically coupled to voltage source 202. The other side of the source-drain path of transistor 306 is electrically coupled to voltage source 202.

The gate of transistor 306 is electrically coupled to the gate of transistor 326, the gate and one side of the source-drain path of transistor 342, one side of the source-drain path of transistor 220, one side of parasitic capacitance 222, and one side of the source-drain path of transistor 226 through signal path 340. The output of Schmitt-trigger 322 provides the data out one (DO1) signal and is electrically coupled to the input of inverter 330 through DO1 signal path 328. The output of inverter 330 is electrically coupled to the gate of transistor 334 through signal path 332. One side of the source-drain path of transistor 334 is electrically coupled to common bias or ground 204. The other side of the source-drain path of transistor 334 is electrically coupled to the input of Schmitt-trigger 322, one side of the source-drain path of transistor 326, and one side of the source-drain path of transistor 336 through signal path 324. The other side of the source-drain path of transistor 336 is electrically coupled to common bias or ground 204. The gate of transistor 336 is electrically coupled to voltage source 202. The other side of the source-drain path of transistor 326 is electrically coupled to voltage source 202.

The other side of the source-drain path of transistor 342 is electrically coupled to voltage source 202. The other side of the source-drain path of transistor 220 is electrically coupled to voltage source 202. The other side of parasitic capacitance 222 is electrically coupled to common bias or ground 204. The gate of transistor 220, the gate of transistor 226, the gate of transistor 230, and the gate of transistor 234 receive the SEL signal on SEL signal path 224. The other side of the source-drain path of transistor 226 is electrically coupled to one side of the source-drain path of transistor 230, one side of parasitic capacitance 232, and one side of the source-drain path of transistor 234 through signal path 228. The other side of the source-drain path of transistor 230 is electrically coupled to voltage source 202. The other side of parasitic capacitance 232 is electrically coupled to common bias or ground 204. The other side of the source-drain path of transistor 234 is electrically coupled to one side of memory cell 238 through signal path 236. The other side of memory cell 238 is electrically coupled to common bias or ground 204.

Transistors 306, 326, 342, 220, and 230 are PMOS transistors, and transistors 314, 316, 334, 336, 226, and 234 are NMOS transistors. Memory cell 238 is a resistive memory cell, such as a phase-change memory cell, a CBRAM memory cell, an MRAM memory cell, or other suitable resistive type non-volatile memory cell. Memory cell 238 stores one or more bits of data as a resistance level. In this embodiment, memory cell 238 stores 1.5 data bits using three resistance levels. The three resistance levels include a first low resistance state, a second medium resistance state, and a third high resistance state.

Schmitt-trigger 302 receives an input voltage on signal path 304 to provide an output signal on DO2 signal path 308. Schmitt-trigger 302 includes a first threshold voltage and a second threshold voltage. The first threshold voltage is less than the second threshold voltage. In response to the input voltage on signal path 304 falling below the first threshold voltage, Schmitt-trigger 302 outputs a logic high DO2 signal on DO2 signal path 308. In response to the input voltage on signal path 304 rising above the second threshold voltage, Schmitt-trigger 302 outputs a logic low DO2 signal on DO2 signal path 308. In response to the input voltage on signal path 304 being between the first threshold voltage and the second threshold voltage, Schmitt-trigger 302 maintains the DO2 signal at its current logic level on DO2 signal path 308. Schmitt-trigger 302 maintains the DO2 signal at its current logic level until the input voltage on signal path 304 rises or falls a sufficient amount to trigger a change in the logic level of the DO2 signal.

Inverter 310 inverts the DO2 signal on DO2 signal path 308 to provide the signal on signal path 312. Transistor 314 provides a holding device for maintaining a logic low DO2 signal in response to a logic low DO2 signal from Schmitt-trigger 302. In response to a logic high signal on signal path 312, transistor 314 turns on to provide a constant voltage on signal path 304. Schmitt-trigger 302 and/or transistor 314 are selected such that the constant voltage on signal path 304 is greater than the first threshold voltage of Schmitt-trigger 302. In response to a logic low signal on signal path 312, transistor 314 turns off. Transistor 316 provides a bypass device that is always on to provide a voltage on signal path 304 in response to a current on signal path 304. In one embodiment, transistor 316 is replaced with a suitably sized resistor.

Schmitt-trigger 322 receives an input voltage on signal path 324 to provide an output signal on DO1 signal path 328. Schmitt-trigger 322 includes a first threshold voltage and a second threshold voltage. The first threshold voltage is less than the second threshold voltage. In response to the input voltage on signal path 324 falling below the first threshold voltage, Schmitt-trigger 322 outputs a logic high DO1 signal on DO1 signal path 328. In response to the input voltage on signal path 324 rising above the second threshold voltage, Schmitt-trigger 322 outputs a logic low DO1 signal on DO1 signal path 328. In response to the input voltage on signal path 324 being between the first threshold voltage and the second threshold voltage, Schmitt-trigger 322 maintains the DO1 signal at its current logic level on DO1 signal path 328. Schmitt-trigger 322 maintains the DO1 signal at its current logic level until the input voltage on signal path 324 rises or falls a sufficient amount to trigger a change in the logic level of the DO1 signal.

Inverter 330 inverts the DO1 signal on DO1 signal path 328 to provide the signal on signal path 332. Transistor 334 provides a holding device for maintaining a logic low DO1 signal in response to a logic low DO1 signal from Schmitt-trigger 322. In response to a logic high signal on signal path 332, transistor 334 turns on to provide a constant voltage on signal path 324. Schmitt-trigger 322 and/or transistor 334 are selected such that the constant voltage on signal path 324 is greater than the first threshold voltage of Schmitt-trigger 322. In response to a logic low signal on signal path 322, transistor 334 turns off. Transistor 336 provides a bypass device that is always on to provide a voltage on signal path 324 in response to a current on signal path 324. In one embodiment, transistor 336 is replaced with a suitably sized resistor.

Transistors 342, 326, and 306 form a current mirror. The input current to the current mirror on signal path 340 is mirrored on signal path 324 to provide a first output current and on signal path 304 to provide a second output current. In one embodiment, the ratio of the gain from the input of the current mirror to the first output of the current mirror is different than the ratio of the gain from the input of the current mirror to the second output of the current mirror. Transistors 342, 326, and 306 are selected to provide the desired ratios. In one embodiment, the first output current is approximately one third the input current and the second output current is approximately two thirds the input current. In other embodiments, other ratios can be used.

In another embodiment, the ratio of the gain from the input of the current mirror to the first output of the current mirror is the same as the ratio of the gain from the input of the current mirror to the second output of the current mirror. In this embodiment where the ratios are the same, transistors 334 and 336 are selected to provide a first voltage in response to the first output current and transistors 314 and 316 are selected to provide a second voltage different from the first voltage in response to the second output current. In one embodiment, the first voltage is approximately one half the second voltage.

In any case, the voltage on signal path 324 is different than the voltage on signal path 304 with memory cell 238 selected. The voltages on signal paths 324 and 304 indicate the resistance state of memory cell 238 with memory cell 238 selected.

The SEL signal is used to select memory cell 238. In response to a logic low SEL signal on SEL signal path 224, transistor 220 turns on to charge parasitic capacitance 222 and provide a precharge voltage on signal path 340. In response to a logic high SEL signal on SEL signal path 224, transistor 220 turns off. In response to a logic low SEL signal on SEL signal path 224, transistor 230 turns on to charge parasitic capacitance 232 and provide a precharge voltage on signal path 228. In response to a logic high SEL signal on SEL signal path 224, transistor 230 turns off.

In response to a logic low SEL signal on SEL signal path 224, transistor 226 turns off to block signals from passing between signal paths 340 and 228. In response to a logic high SEL signal on SEL signal path 224, transistor 226 turns on to pass signals between signal paths 340 and 228. In response to a logic low SEL signal on SEL signal path 224, transistor 234 turns off to block signals from passing between signal paths 228 and 236. In response to a logic high SEL signal on SEL signal path 224, transistor 234 turns on to pass signals between signal paths 228 and 236.

In operation, during a standby mode, the SEL signal is logic low. With the SEL signal logic low, transistors 220 and 230 are turned on to precharge signal paths 340 and 228 up to the voltage provided by voltage source 202. To read memory cell 238, the resistance of the memory cell is sensed. Memory cell 238 is selected by providing a logic high SEL signal.

With the SEL signal logic high, transistors 220 and 230 turn off and transistors 226 and 234 turn on to select memory cell 238. If memory cell 238 is in the first low resistance state, a first current flows through memory cell 238. If memory cell 238 is in the second medium resistance state, a second current less than the first current flows through memory cell 238. If memory cell 238 is in the third high resistance state, a third current less than the second current flows through memory cell 238.

If memory cell 238 is in the first low resistance state, the voltage generated on signal path 324 is greater than the second threshold voltage of Schmitt-trigger 322. Therefore, Schmitt-trigger 322 outputs a logic low DO1 signal. The logic low DO1 signal is inverted by inverter 330 to turn on transistor 334. Transistor 334 and transistor 336 provide a constant bias voltage on signal path 324. The constant bias voltage on signal path 324 is greater than the first threshold voltage of Schmitt-trigger 322, such that the DO1 signal remains logic low.

With memory cell 238 in the first low resistance state, the voltage generated on signal path 304 is also greater than the second threshold voltage of Schmitt-trigger 302. Therefore, Schmitt-trigger 302 outputs a logic low DO2 signal. The logic low DO2 signal is inverted by inverter 310 to turn on transistor 314. Transistor 314 and transistor 316 provide a constant bias voltage on signal path 304. The constant bias voltage on signal path 304 is greater than the first threshold voltage of Schmitt-trigger 302, such that the DO2 signal remains logic low.

If memory cell 238 is in the second medium resistance state, the voltage generated on signal path 324 is less than the first threshold voltage of Schmitt-trigger 322. Therefore, Schmitt-trigger 322 outputs a logic high DO1 signal. The logic high DO1 signal is inverted by inverter 330 to turn off transistor 334. Transistor 336 provides a constant bias voltage on signal path 324. The constant bias voltage on signal path 324 is less than the second threshold voltage of Schmitt-trigger 322, such that the DO1 signal remains logic high.

With memory cell 238 in the second medium resistance state, the voltage generated on signal path 304 is greater than the second threshold voltage of Schmitt-trigger 302. Therefore, Schmitt-trigger 302 outputs a logic low DO2 signal. The logic low DO2 signal is inverted by inverter 310 to turn on transistor 314. Transistor 314 and transistor 316 provide a constant bias voltage on signal path 304. The constant bias voltage on signal path 304 is greater than the first threshold voltage of Schmitt-trigger 302, such that the DO2 signal remains logic low.

If memory cell 238 is in the third high resistance state, the voltage generated on signal path 324 is less than the first threshold voltage of Schmitt-trigger 322. Therefore, Schmitt-trigger 322 outputs a logic high DO1 signal. The logic high DO1 signal is inverted by inverter 330 to turn off transistor 334. Transistor 336 provides a constant bias voltage on signal path 324. The constant bias voltage on signal path 324 is less than the second threshold voltage of Schmitt-trigger 322, such that the DO1 signal remains logic high.

With memory cell 238 is in the third high resistance state, the voltage generated on signal path 304 is less than the first threshold voltage of Schmitt-trigger 302. Therefore, Schmitt-trigger 302 outputs a logic high DO2 signal. The logic high DO2 signal is inverted by inverter 310 to turn off transistor 314. Transistor 316 provides a constant bias voltage on signal path 304. The constant bias voltage on signal path 304 is less than the second threshold voltage of Schmitt-trigger 302, such that the DO2 signal remains logic high.

A logic low DO1 signal and a logic low DO2 signal indicate that memory cell 238 is in the first low resistance state. A logic high DO1 signal and a logic low DO2 signal indicate that memory cell 238 is in the second medium resistance state. A logic high DO1 signal and a logic high DO2 signal indicate that memory cell 238 is in the third high resistance state. The DO1 signal and the DO2 signal are latched by another circuit (not shown), which can decode the DO1 signal and the DO2 signal to provide an output signal indicating the data stored in memory cell 238. The output signal indicating the data stored in memory cell 238 can be output with a strobe signal while the SEL signal is logic high.

Additional resistance states can be sensed for memory cell 238 by increasing the number of Schmitt-triggers and associated circuitry. For example, four resistance states or two data bits can be sensed using three Schmitt-triggers. Any suitable number of Schmitt-triggers and associated circuitry can be added to achieve the desired number of data bits for multi-bit sensing.

Embodiments of the present invention provide a method for single ended sensing of the resistance state of a memory cell using one or more Schmitt-triggers. Differential sensing is not used for reading the state of each memory cell. No control signals are used to activate the one or more Schmitt-triggers. Due to the structure of Schmitt-triggers, low static power consumption is achieved. In addition, the analog requirements for each Schmitt-trigger, such as the accuracy of trigger levels, are relaxed since a large margin exists between resistance states.

What is claimed is:

1. A memory comprising:
   a resistive memory cell; and
   a circuit configured to provide an output signal indicating a state of the memory cell based on a comparison of a voltage across the memory cell to a threshold voltage, wherein the circuit comprises:
   a Schmitt-trigger comfigured to provide an output signal indicating a state of the memory cell based on a voltage across the memory cell;
   a hold device configured to maintain the voltage across the memory cell at a voltage level indicating a low resistive state of the memory cell;
   a bypass device configured to maintain the voltage across the memory cell at a voltage level indicating a high resistive state of the memory cell; and
   a precharge circuit configured to precharge a bit line coupled to the memory cell.

2. The memory of claim 1, wherein the memory cell comprises a phase-change memory cell.

3. The memory of claim 1, wherein the memory cell comprises a magneto-resistive memory cell.

4. A method for determining a state of a memory cell, the method comprising:
- precharging a bit line to a first voltage;
- selecting a resistive memory cell to provide a second voltage on the bit line indicating a state of the memory cell;
- comparing the second voltage to a threshold voltage; and
- triggering an output signal indicating the state of the memory cell based on the comparison,
- wherein the method comprises in response to a low resistive state of the memory cell providing a current on the bit line through a hold device to maintain the second voltage on the bit line at a voltage level indicating a low resistive state of the memory cell, and
- wherein the method comprises in response to a high resistive state of the memory cell providing a current on the bit line through a bypass device to maintain the second voltage on the bit line at a voltage level indicating a high resistive state of the memory cell.

5. The method of claim 4, wherein comparing the second voltage comprises comparing the second voltage to a threshold voltage in a Schmitt-trigger.

6. The method of claim 4, wherein selecting the resistive memory cell comprises selecting a phase-change memory cell.

7. The method of claim 4, wherein selecting the resistive memory cell comprises selecting one of a magneto-resistive memory cell and a conductive bridging memory cell.

8. The memory of claim 1,
- wherein the resistive memory cell comprises a conductive bridging memory cell.

* * * * *